(12) United States Patent
Lee et al.

(10) Patent No.: US 8,329,500 B2
(45) Date of Patent: Dec. 11, 2012

(54) METHOD OF MANUFACTURING PHOTOVOLTAIC DEVICE

(75) Inventors: Byoung-Kyu Lee, Suwon-si (KR);
Se-Jin Chung, Yongin-si (KR);
Byoung-June Kim, Seoul (KR);
Czang-Ho Lee, Hwaseong-si (KR);
Myung-Hun Shin, Suwon-si (KR);
Min-Seok Oh, Yongin-si (KR);
Ku-Hyun Kang, Suwon-si (KR);
Yuk-Hyun Nam, Goyang-si (KR);
Seung-Jae Jung, Seoul (KR); Min Park, Seoul (KR); Mi-Hwa Lim, Chungeheongnam-do (KR); Joon-Young Seo, Seoul (KR)

(73) Assignees: Samsung Display Co., Ltd., Yongin, Gyeonggi-do (KR); Samsung SDI Co., Ltd., Yongin-si, Gyeonggi-do (KR)

( * ) Notice: Subject to any disclaimer, the term of this patent is extended or adjusted under 35 U.S.C. 154(b) by 339 days.

(21) Appl. No.: 12/642,527

(22) Filed: Dec. 18, 2009

(65) Prior Publication Data
US 2010/0159633 A1   Jun. 24, 2010

(30) Foreign Application Priority Data
Dec. 18, 2008   (KR) .......................... 10-2008-0129441

(51) Int. Cl.
*H01L 21/00* (2006.01)

(52) U.S. Cl. ................ 438/88; 438/89; 438/96; 438/97; 438/98; 257/52; 257/56; 257/58; 257/E31.11; 257/E21.327

(58) Field of Classification Search ........................ None
See application file for complete search history.

(56) References Cited

U.S. PATENT DOCUMENTS

| | | | |
|---|---|---|---|
| 5,288,658 A | | 2/1994 | Ishihara |
| 5,644,145 A | * | 7/1997 | Ishihara .......................... 257/52 |
| 6,043,427 A | * | 3/2000 | Nishimoto .................... 136/258 |
| 6,472,248 B2 | * | 10/2002 | Shiozaki et al. ................ 438/97 |
| 6,521,826 B2 | * | 2/2003 | Wada ............................ 136/255 |

FOREIGN PATENT DOCUMENTS

JP   402027775 A  *  1/1990

* cited by examiner

*Primary Examiner* — Zandra Smith
*Assistant Examiner* — Khanh Duong
(74) *Attorney, Agent, or Firm* — Lee & Morse, P.C.

(57) ABSTRACT

Provided is a method of manufacturing a photovoltaic device using a Joule heating-induced crystallization method. The method includes: forming a first conductive pattern on a substrate; forming a photoelectric conversion layer on the substrate having the first conductive pattern; and crystallizing at least part of the photoelectric conversion layer by applying an electric field to the photoelectric conversion layer, wherein the photoelectric conversion layer includes a first amorphous semiconductor layer containing first impurities, a second intrinsic, amorphous semiconductor layer, and a third amorphous semiconductor layer containing second impurities.

22 Claims, 9 Drawing Sheets

METHOD OF MANUFACTURING PHOTOVOLTAIC DEVICE

RELATED APPLICATION(S)

This application claims priority from Korean Patent Application No. 10-2008-0129441 filed on Dec. 18, 2008 in the Korean Intellectual Property Office, the disclosure of which is incorporated herein by reference in its entirety.

BACKGROUND OF THE INVENTION

1. Field of the Invention

The present invention relates to a method of manufacturing a photovoltaic device, and more particularly, to a method of manufacturing a photovoltaic device used in a solar cell, the photovoltaic device including a fine crystalline semiconductor layer.

2. Description of the Related Art

A solar cell is a type of photovoltaic device that converts solar energy directly into electricity. It is a key element in solar power generation.

The most basic structure of a solar cell is a P-N junction diode. Solar cells may be classified into compound solar cells using CIGS(CuInGaSe2) or CdTe, Group III-V solar cells, dye-sensitized solar cells, organic solar cells, and silicon solar cells according to the material of a light-absorbing layer. Furthermore, silicon solar cells may be classified into crystalline solar cells and thin-film solar cells.

A thin-film solar cell includes thin films coated on a transparent substrate, such as thin glass or plastic, or a metal substrate such as stainless foil. Due to characteristics of thin films therein, thin-film solar cells have a far shorter diffusion length of carriers than crystalline solar cells. Thus, thin-film solar cells in a PN junction structure have very low collection efficiency of electron-hole pairs. For this reason, thin-film solar cells have a PIN structure in which an intrinsic semiconductor material having a high light absorption rate is inserted between a P-type semiconductor and an N-type semiconductor.

Light efficiency of a solar cell is affected by the structure and design of the solar cell and the quality and thickness of each thin film of the solar cell. In particular, the structure of a solar cell must be selected very carefully.

A thin-film solar cell using amorphous silicon (a-Si:H) and fine crystalline silicon (mc-Si:H) or amorphous silicon-germanium (a-SiGe:H) utilizes a thin film with a thickness of several microns or less as a light absorbing layer. In addition, silicon itself has a low light absorption coefficient. Thus, there is a limit to achieving high light efficiency using a single PIN junction. To address this problem, a layered solar cell, in which a PIN solar cell having amorphous silicon (a-Si:H) and fine crystalline silicon (mc-Si:H) is formed in double or triple layers, is used. In this layered solar cell, the PIN solar cells are connected in series to each other, thereby increasing an open-circuit voltage and improving the efficiency of converting incident light into electricity.

A fine crystalline semiconductor material advantageously has a high light absorption rate in a long wavelength region and low optical degradation characteristics. However, a fine crystalline semiconductor material is generally required to have a thickness of 2 to 3 microns and a crystallization of 60 to 70%. Thus, it takes a long time to form a fine crystalline semiconductor material using a conventional deposition method that has a very low deposition speed.

In this regard, a lot of researchers have suggested various equipments and technologies, such as hot-wall chemical vapor deposition (CVD), very high frequency CVD (VHF CVD), ion-coupled VHF CVD (ICP-VHF CVD), and microwave plasma enhanced CVD (PECVD), to increase the deposition speed of a fine crystalline semiconductor material. However, the improvement in the deposition speed is negligible.

Meanwhile, technologies for forming an amorphous semiconductor which can be formed relatively faster than a fine crystalline semiconductor and converting the amorphous semiconductor into a fine crystalline semiconductor or a polycrystalline semiconductor through a separate crystallization process are being variously applied in display devices, such as liquid crystal display substrates and organic light-emitting diodes. Of the above technologies, a solid phase crystallization (SPC) method has the advantage of achieving crystallization using inexpensive equipment. However, the SPC method requires a high crystallization temperature of 600 to 700, and a long processing time of 1 to 24 hours. Thus, a transparent substrate or a metal substrate having a low melting point cannot be used. Moreover, since a polycrystalline semiconductor material formed by the SPC method includes a lot of crystal lattice defects, such as twin crystals, and has a large grain size, its light absorption rate is reduced.

SUMMARY OF THE INVENTION

Aspects of the present invention provide a method of manufacturing a photovoltaic device using a Joule heating-induced crystallization method.

However, aspects of the present invention are not restricted to the one set forth herein. The above and other aspects of the present invention will become more apparent to one of ordinary skill in the art to which the present invention pertains, by referencing the detailed description of the present invention given below.

According to an aspect of the present invention, a method of manufacturing a photovoltaic device is provided. The method includes: forming a first conductive pattern on a substrate; forming a photoelectric conversion layer on the substrate having the first conductive pattern; and crystallizing at least part of the photoelectric conversion layer by applying an electric field to the photoelectric conversion layer, wherein the photoelectric conversion layer includes a first amorphous semiconductor layer containing first impurities, a second intrinsic, amorphous semiconductor layer, and a third amorphous semiconductor layer containing second impurities.

According to another aspect of the present invention, a method of manufacturing a photovoltaic device is provided. The method includes: forming a first conductive pattern, in which one or more electric field appliers are defined, on a substrate; forming a photoelectric conversion layer on the first conductive pattern; forming a second conductive layer on the photoelectric conversion layer; and exposing the electric field appliers between the forming of the photoelectric conversion layer and the forming of the second conductive layer or after the forming of the second conductive layer, wherein the photoelectric conversion layer includes a first amorphous semiconductor layer containing first impurities, a second intrinsic, amorphous semiconductor layer, and a third amorphous semiconductor layer containing second impurities.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
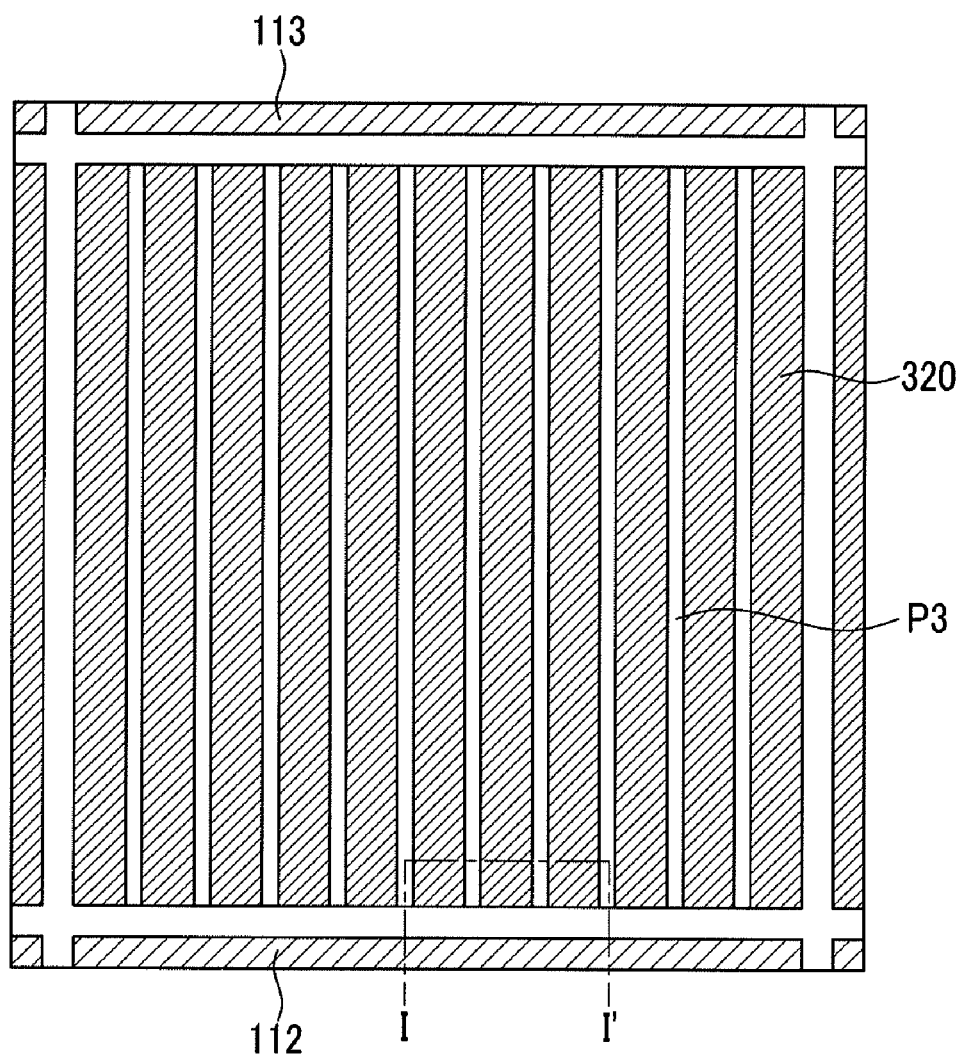
FIG. 1 is a plan view of a solar cell module manufactured using a photovoltaic device according to an exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. Like reference numerals refer to like elements throughout the specification.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Hereinafter, exemplary embodiments of the present invention will be described in detail with reference to the attached drawings.

Figure 2:
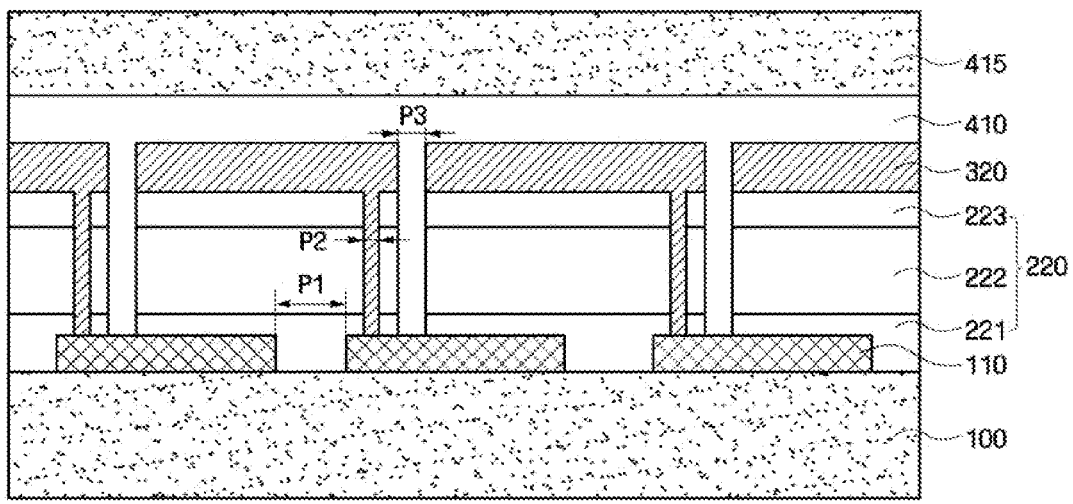
FIG. 2 is a cross-sectional view of the solar cell module taken along the line I-I' of FIG. 1.

First, a solar cell module manufactured using a photovoltaic device according to an exemplary embodiment of the present invention will be described in detail with reference to FIGS. 1 and 2. FIG. 1 is a plan view of a solar cell module manufactured using a photovoltaic device according to an exemplary embodiment of the present invention. FIG. 2 is a cross-sectional view of the solar cell module taken along the line I-I' of FIG. 1.

Referring to FIGS. 1 and 2, a first conductive pattern 110 is formed on a first substrate 100 which may be a transparent substrate, such as glass or plastic, or a metal substrate such as stainless foil. The first conductive pattern 110 includes a plurality of line patterns which are separated from each other by a gap P1 using a well-known scribing process. The gap P1 electrically separates the first conductive patterns from one another.

Electric field appliers 112 and 113 may be formed in edge regions of the first substrate 100. In detail, each of the electric field appliers 112 and 113 may extend parallel to at least one of four edges of the first substrate 100.

The electric field appliers 112 and 113 may be made of the same material as the first conductive pattern 110. In addition, the electric field appliers 112 and 113 may be formed at the same level as the first conductive pattern 110 and be physically separated from the first conductive pattern 110. This is because, as will be described later in relation to a method of manufacturing a photovoltaic device, the electric field appliers 112 and 113 are defined in the first conductive pattern 110 and are separated from the first conductive pattern 110 by the scribing process.

A first fine crystalline semiconductor layer 221 containing first impurities, a second intrinsic, fine crystalline semiconductor layer 222 functioning as a light-absorbing layer, and a third fine crystalline semiconductor layer 223 containing second impurities are sequentially formed on the first substrate 100, which has the first conductive pattern 110, to form a photoelectric conversion layer 220. The first and second impurities are of different types.

If the solar cell module according to the present embodiment is a substrate-type solar cell in which light is incident on a front surface of a substrate (e.g. substrate 415 of FIG. 2), the first fine crystalline semiconductor layer 221 containing the first impurities may be of an N type, and the third fine crystalline semiconductor layer 223 containing the second impurities may be of a P type. Accordingly, photoelectric conversion sequentially occurs in the PIN layers formed in this order from a direction in which light is incident. The photoelectric conversion layer 220 has a gap P2 which may be formed by the scribing process, and the gap P2 extends to each line pattern of the first conductive pattern 110. The gap P2 divides the photoelectric conversion layer 220 into cells and allows an electrical connection to be established between the second conductive patterns 320 and the first conductive pattern 110. The first conductive pattern 110 may be transparent or opaque, and this invention is not limited to being used in a substrate-type or superstrate-type solar cell. A "substrate-type" solar cell typically has a thin film formed on one substrate (which may be transparent or not) and a transparent second substrate. A "superstrate-type" solar cell typically has a first (transparent) electrically conductive layer formed on a transparent substrate and a second electrically conductive layer. Making the substrate and the electrode that are close to the light-incident side transparent usually improves cell efficiency.

Second conductive patterns 320 are formed on the photoelectric conversion layer 220. The second conductive patterns 320 may be made of aluminum doped zinc oxide (ZAO, zinc oxide (ZnO): aluminum (Al)), molybdenum (Mo), indium tin oxide (ITO), copper (Cu), tungsten (W), aluminum (Al), or an alloy of the same. Alternatively, the second conductive patterns 320 may be made of a stack of two or more materials such as ZAO/Al or ZAO/Mo. The second conductive patterns 320 are separated from each other by a predetermined gap and are electrically connected to the first conductive pattern 110. Specifically, the second conductive patterns 320 are separated from each other by a gap P3, and the gap P3 may be formed by the scribing process to electrically separate the second conductive patterns 320 from one another.

The gap P3 of the second conductive patterns 320 is formed adjacent to the gap P2 of the photoelectric conversion layer 220. Just after its formation (and before deposition of layers thereon), the gap P3 exposes part of each line pattern of the first conductive pattern 110.

An adhesive film 410 is formed on the second conductive patterns 320. For example, the adhesive film 410 may be adhered to the second conductive patterns 320. A second substrate 415 is formed on the adhesive film 410.

Hereinafter, a method of manufacturing a photovoltaic device according to an exemplary embodiment of the present invention will be described in detail with reference to FIGS. 3A through 7. FIGS. 3A through 7 are views showing intermediate structures resulting from processes included in a method of manufacturing a photovoltaic device, according to an exemplary embodiment of the present invention.

Figure 3A:
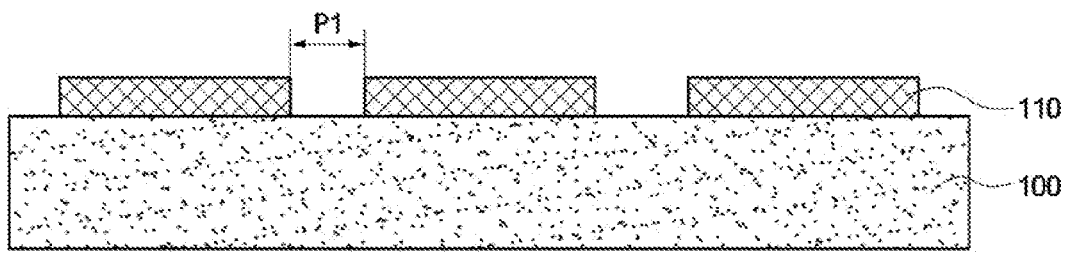
FIGS. 3A through 7 are views showing intermediate structures resulting from processes included in a method of manufacturing a photovoltaic device according to an exemplary embodiment of the present invention.

Referring to FIG. 3A, a conductive layer is formed on a first substrate 100 by, e.g., sputtering. Then, the conductive layer is partially removed by performing a scribing process in a predetermined direction. As a result, a first conductive pattern 110 is formed. The conductive layer may be made of ZAO (ZnO:Al), molybdenum (Mo), indium tin oxide ITO, copper (Cu), tungsten (W), aluminum (Al), or an alloy of the same. Alternatively, the conductive layer may be made of a stack of two or more materials such as ZAO/Al or ZAO/Mo. The first conductive pattern 110 may be formed to a thickness of 2,000 to 10,000 Å.

Figure 3B:
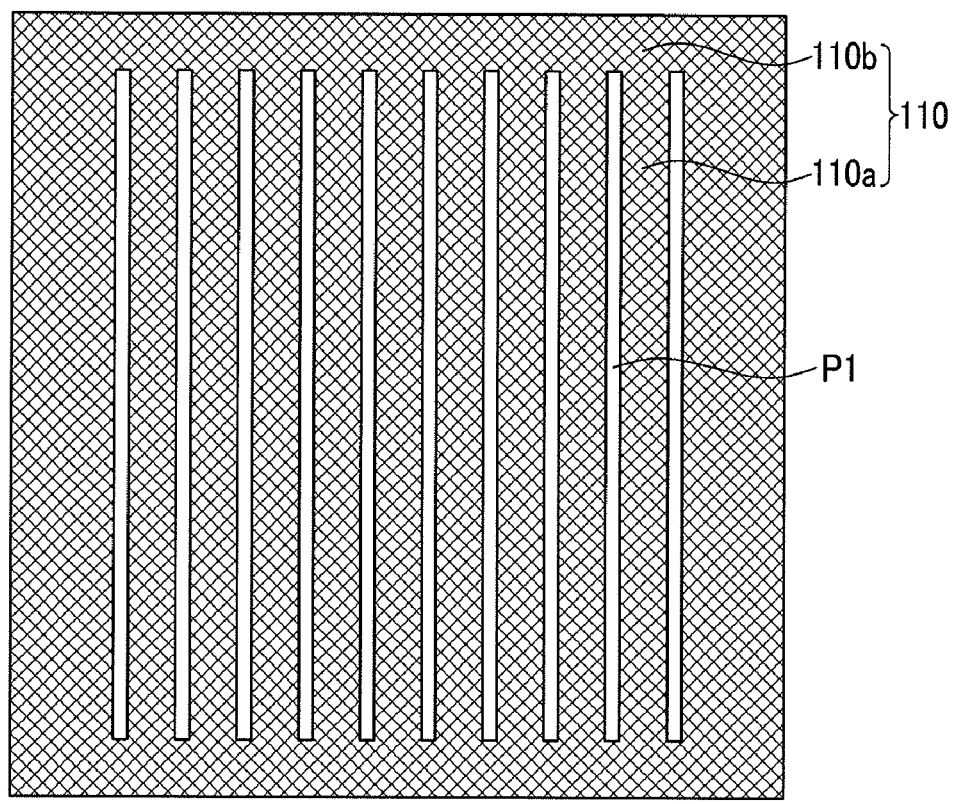

Referring to FIG. 3B, which is a plan view of FIG. 3A, the first conductive pattern 110 may include a plurality of line patterns 110a and a plurality of connecting patterns 110b which physically connect the line patterns 110a to each other. The plurality of line patterns 110a are electrically separated from each other by gap P1.

Each of the connecting patterns 110b is formed to a width of approximately 5 to 50 nm from an edge of the first substrate 100. As will be described later, at least part of each of the connecting patterns 110b will be used as an electric field applier 112 or 113.

Figure 4A:
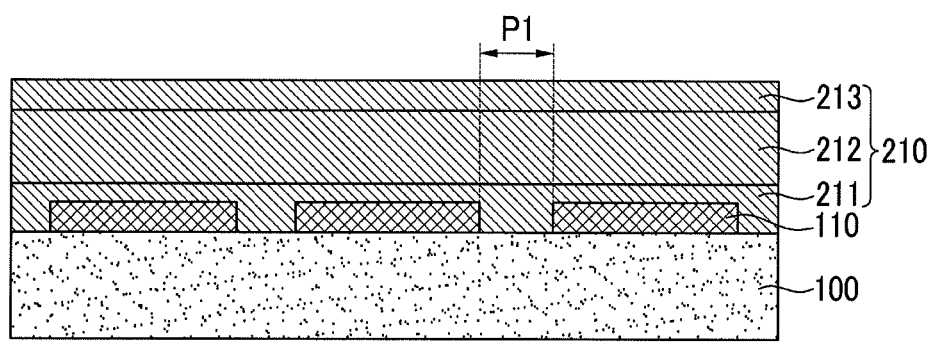

Referring to FIG. 4A, a first amorphous semiconductor layer 211 containing first impurities, a second intrinsic, amorphous semiconductor layer 212, and a third amorphous semiconductor layer 213 containing second impurities are sequentially formed on the first substrate 100, which has the first conductive pattern 110, to form a photoelectric conversion layer 210. Specifically, the photoelectric conversion layer 210 is formed by plasma enhanced chemical vapor deposition (PECVD) to a thickness of 10,000 to 30,000 Å. The thickness of the photoelectric conversion layer 210 should fall within the above range in view of the deposition time and the quality of a polycrystalline semiconductor film formed by solid phase crystallization (SPC) which is performed subsequent to the deposition process. When its thickness falls within the above range, the photoelectric conversion layer 210 can secure desired characteristics.

The first through third amorphous semiconductor layers 211 through 213 may be successively formed. Alternatively, the first and second amorphous semiconductor layers 211 and 212 excluding the third amorphous semiconductor layer 213 that contains the second impurities may first be formed. The first impurities of the first amorphous semiconductor layer 211 are usually Group VB impurities, and the second impurities of the third amorphous semiconductor layer 213 are often Group IIIB impurities.

Figure 4B:
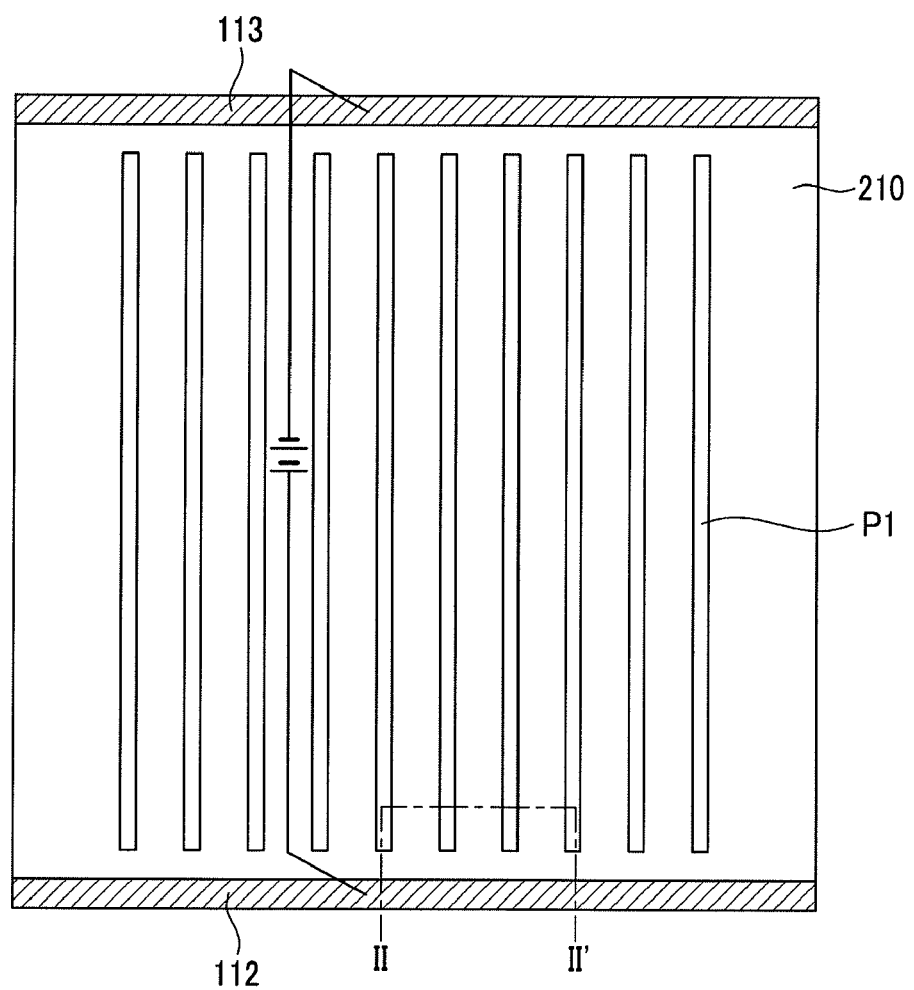

Referring to FIG. 4B, the scribing process or an etching process is performed on a region extending approximately 5 to 50 nm from an edge of the first substrate 100 to expose each of the electric field appliers 112 and 113, that is, expose part of each of the connecting patterns 110b. Each of the electric field appliers 112 and 113 is formed on at least one of four edges of the first substrate 100.

In FIGS. 4A and 4B, the scribing or etching process is used to expose the electric field appliers 112 and 113. However, the present invention is not limited thereto. For example, no separate scribing or etching process may be performed to expose the electric field appliers 112 and 113. Instead, when the first through third amorphous semiconductor layers 211 through 213 are formed, they may be prevented from being deposited on the electric field appliers 112 and 113 by using a shadow mask.

The electric field appliers 112 and 113 should maintain a uniform thickness so as to have uniform heating during Joule heating caused by subsequent application of an electric field. The electric field appliers 112 and 113 can secure favorable characteristics when having a thickness uniformity, $\Delta_u$ (in %), of 10% or less, based on the following equation:

$$\Delta_u = 100 \times \frac{(d_{max} - d_{min})}{d_{max}}. \tag{1}$$

Where $d_{max}$ is the maximum thickness, and $d_{min}$ is the minimum thickness of the electric field applier.

Referring back to FIG. 4B, an electric field is applied to each of the electric field appliers 112 and 113, which are formed on opposite edges of the first substrate 100, to crystallize the photoelectric conversion layer 210 having the first through third amorphous semiconductor layers 211 through 213, formed on the first conductive pattern 110. The application of an electric field to each of the electric field appliers 112 and 113 is performed by applying, for a very short time, energy with a power density that can generate sufficiently intense heat to induce crystallization of the first through third amorphous semiconductor layers 211 through 213, by Joule heating. FIG. 4B shows exposed electric field appliers 112 and 113, photoelectric conversion layer 210, and gap P1. However, the photoelectric conversion layer 210 of FIG. 4B actually covers the gap P1, as shown in FIG. 4A, which is a cross-sectional view taken along the line II-II' of FIG. 4B before the electric field is applied. The gap P1 in FIG. 4B is shown for the purposes of illustration.

Crystallization of amorphous silicon by Joule heating has previously been done. Without being limited to a particular theory, it is now reported that intrinsic carriers are generated in an amorphous semiconductor layer heated to a certain temperature and reduce the electrical resistance value of the amorphous semiconductor layer, thereby making Joule heating possible.

The amount of energy per unit time applied to a conductive layer by Joule heating due to electric field application may be defined by the following equation.

$$W = V \times I, \tag{2}$$

where W represents the amount of energy per unit time supplied by Joule heating, V represents the voltage applied to both ends of the conductive layer, and I represents the current. It can be understood from the above equation that, as the voltage (V) or the current (I) increases, the amount (W) of energy per unit time applied to the conductive layer by Joule heating also increases.

Thus, when a strong electric field is applied to conductive layers, intense heat is instantaneously generated by Joule heating, thereby crystallizing a semiconductor layer interposed between the conductive layers.

In Joule heating-induced crystallization, it is important to apply an electric field within 1/100,000 to 1 second. When the first through third amorphous semiconductor layers 211 through 213 are crystallized for such a short time, the first substrate 100 is not deformed even if the first conductive pattern 110 is heated to a very high temperature by using the electric field appliers 112 and 113. In addition, the rapid crystallization of the first through third amorphous semiconductor layers 211 through 213 can prevent the first impurities of the first amorphous semiconductor layer 211 and the second impurities of the third amorphous semiconductor layer 213 from being diffused to the second intrinsic, amorphous semiconductor layer 212.

Figure 5:
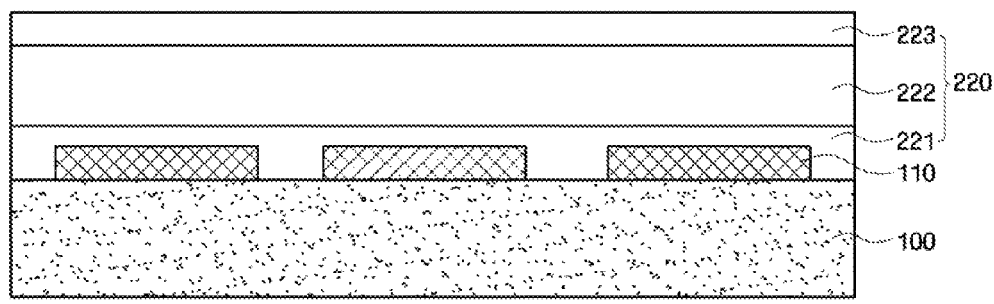

FIG. 5 is a cross-sectional view of a structure including the photoelectric conversion layer 220 crystallized by a Joule heating-induced crystallization method. A semiconductor layer, manufactured using the Joule heating-induced crystallization method, may include a fine crystalline structure and secure a good photoelectric conversion effect when having a crystallization of 60 to 70%.

The photoelectric conversion layer 220 manufactured using the Joule heating-induced crystallization method may include a first fine crystalline semiconductor layer 221 containing the first impurities, a second intrinsic, fine crystalline semiconductor layer 222, and a third fine crystalline semiconductor layer 223 containing the second impurities. Here, the third semiconductor layer 223 containing the second impurities may not be finely crystallized, depending on the efficiency of the Joule heating-induced crystallization method. Instead, the third semiconductor layer 223 may be an amorphous semiconductor layer.

Another photoelectric conversion layer 230 may be formed on the photoelectric conversion layer 220, which has been manufactured using the Joule heating-induced crystallization method, to improve photoelectric conversion efficiency. Consequently, a photovoltaic device having a tandem or triple structure may be manufactured. In this case, an intermediate layer may further be formed between the lower photoelectric conversion layer 220 and the upper photoelectric conversion layer 230. The intermediate layer may be formed as a transparent conductive film that can partially transmit and partially reflect the light incident between the lower and upper photoelectric conversion layers 220, and 230

Figure 6:
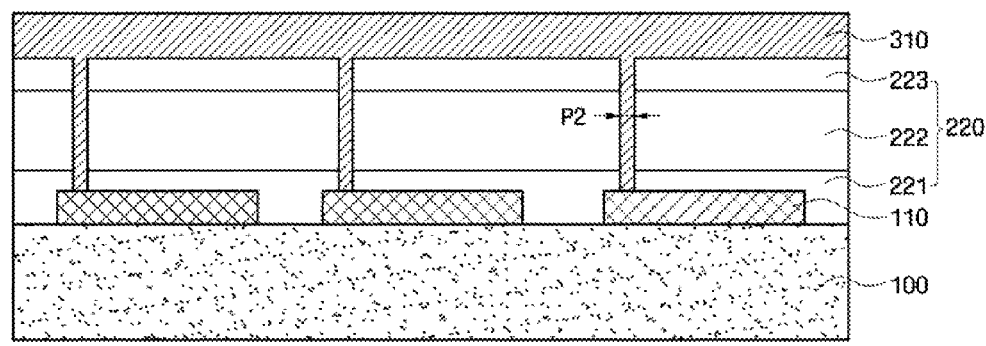

Referring to FIG. 6, the photoelectric conversion layer 220 manufactured using Joule heating-induced crystallization method is patterned by the scribing process at intervals of P2 to expose part of each of the line patterns 110a of the first conductive pattern 110 thereunder.

Next, a second conductive layer 310 is formed on the photoelectric conversion layer 220. Since the gap P2 is also filled with the second conductive layer 310, the second conductive layer 310 is electrically connected to the first conductive pattern 110.

Figure 7:
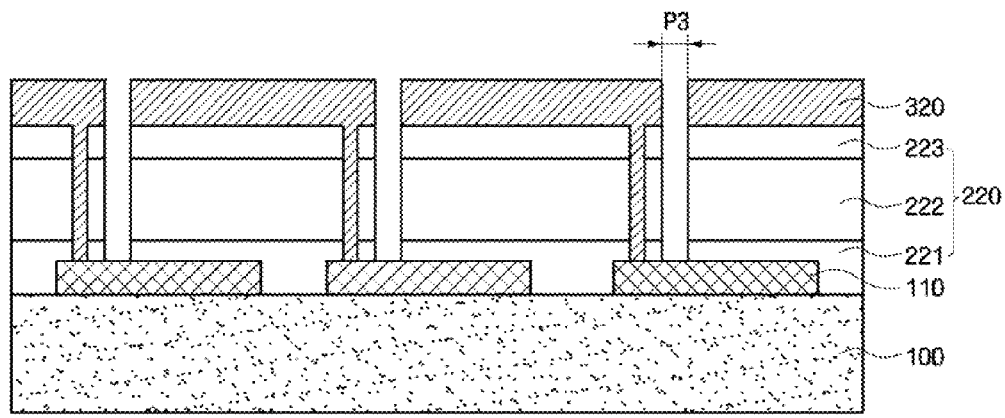

Referring to FIG. 7, a gap P3 is formed by the scribing process in each region adjacent to the gap P2. The gap P3 separates neighboring portions of the photoelectric conversion layer 200 and separates neighboring portions of the second conductive patterns 320.

Although not shown in the drawing, an edge isolation process may further be performed to isolate the line conductive patterns 110a from the connecting patterns 110b. As a result, the electric field appliers 112 and 113 may be isolated from the first conductive pattern 110 or the second conductive patterns 320.

Hereinafter, a method of manufacturing a photovoltaic device according to another exemplary embodiment of the present invention will be described in detail with reference to FIGS. 8 through 10. No overlapping description of the present and previous embodiments will be given.

Figure 8:
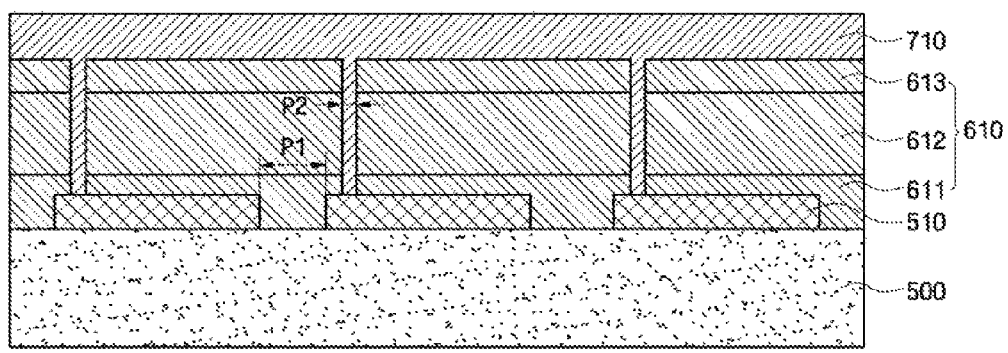
FIGS. 8 through 10 are views showing intermediate structures resulting from processes included in a method of manufacturing a photovoltaic device according to another exemplary embodiment of the present invention.

Referring to FIG. 8, a first conductive pattern 510, in which at least one electric field applier 511 is defined (see FIG. 9), is formed on a substrate 500. Then, a photoelectric conversion layer 610 is formed on the first conductive pattern 510. The photoelectric conversion layer 610 includes a first amorphous semiconductor layer 611 containing first impurities, a second intrinsic, amorphous semiconductor layer 612, and a third amorphous semiconductor layer 613, containing second impurities. Next, the photoelectric conversion layer 610 is scribed to form a gap P2. Then, a second conductive layer 710 is formed on the photoelectric conversion layer 610. Here, the first conductive pattern 510, which is partially exposed by the gap P2, is electrically connected to the second conductive layer 710 by the gap P2. Next, the electric field applier 511 is exposed.

Figure 9:
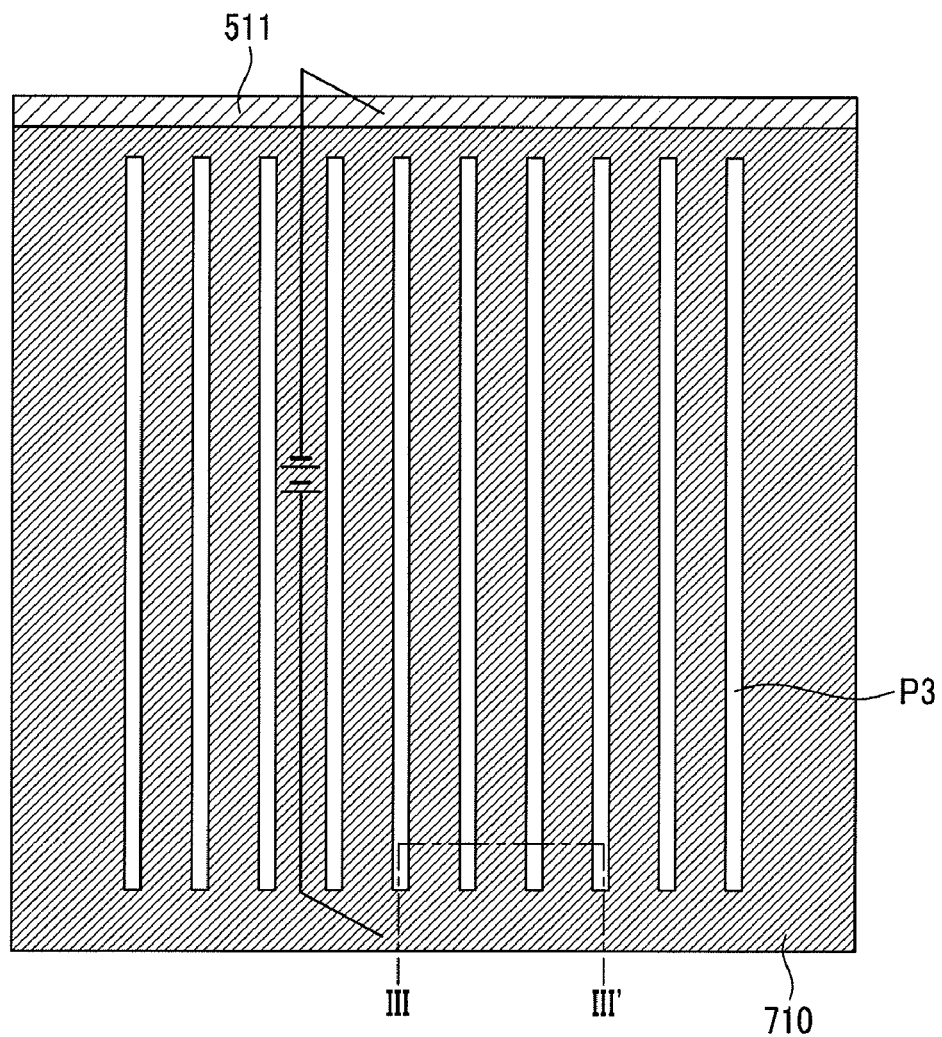

Referring to FIG. 9, the electric field applier 511 exposed on at least one of edges of the substrate 500 is made to contact a position on the second conductive layer 710, and an electric field is applied to the electric field applier 511 and the second conductive layer 710. Accordingly, the first conductive pattern 510 and the second conductive layer 710 are heated to a high temperature for a short time, thereby crystallizing the photoelectric conversion layer 610, which includes the first through third amorphous semiconductor layers 611 through 613 interposed between the first conductive pattern 510 and the second conductive layer 710, by Joule heating.

Figure 10:
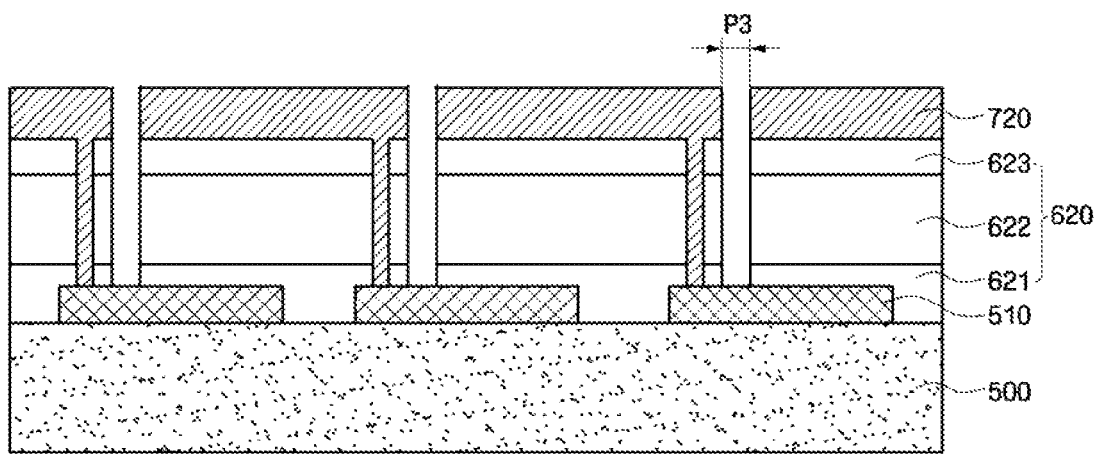

Referring to FIG. 10, a gap P3 is formed by the scribing process in each region adjacent to the gap P2. As a result, the crystallized photoelectric conversion layer 620 and second conductive patterns 720 are formed and electrically isolated from each other.

Specifically, the photoelectric conversion layer 610 shown in FIG. 8, having the first through third amorphous semiconductor layers 611 through 613, can be crystallized using the Joule heating-induced crystallization method to produce the crystallized photoelectric conversion layer 620 having first through third fine crystalline semiconductor layers 621 through 623 of good quality, without deforming the substrate 500. Furthermore, a photovoltaic device can be manufactured using the crystallized photoelectric conversion layer 620, thereby enhancing photoelectric conversion efficiency thereof While the present invention has been particularly shown and described with reference to exemplary embodiments thereof, it will be understood by those of ordinary skill in the art that various changes in form and detail may be made therein without departing from the spirit and scope of the present invention, as defined by the following claims. The exemplary embodiments should be considered in a descriptive sense only and not for purposes of limitation.

What is claimed is:
1. A method of manufacturing a photovoltaic device, the method comprising:
  forming a first conductive pattern on a substrate;
  forming a photoelectric conversion layer on the substrate having the first conductive pattern; and crystallizing at least part of the photoelectric conversion layer by applying an electric field to the photoelectric conversion layer, wherein the photoelectric conversion layer comprises a first amorphous semiconductor layer containing first impurities, a second intrinsic, amorphous semiconductor layer, and a third amorphous semiconductor layer containing second impurities.

2. The method of claim 1, wherein one or more electric field appliers are defined in the first conductive pattern.

3. The method of claim 2, wherein a plurality of electric field appliers are defined in the first conductive pattern and separated from each other, further comprising exposing the electric field appliers by removing part of the photoelectric conversion layer after the forming of the photoelectric conversion layer, and wherein, in the crystallizing of at least part of the photoelectric conversion layer, an electric field is applied to the photoelectric conversion layer by applying an electric field to the electric field appliers.

4. The method of claim 3, further comprising forming second conductive patterns on the photoelectric conversion layer after the crystallizing of at least part of the photoelectric conversion layer 5. The method of claim 4, further comprising:
forming said second conductive pattern of two or more layers including at least one of aluminum doped zinc oxide, aluminum, and molybdenum.

6. The method of claim 2, further comprising:
forming a second conductive layer on the photoelectric conversion layer after the forming of the photoelectric conversion layer; and
exposing the electric field appliers by removing part of the second conductive layer and part of the photoelectric conversion layer after the forming of the second conductive layer,
wherein, in the crystallizing of at least part of the photoelectric conversion layer, an electric field is applied to the photoelectric conversion layer by applying an electric field to the exposed electric appliers and the second conductive layer.

7. The method of claim 2, wherein the first conductive pattern comprises a plurality of line conductive patterns and a plurality of connecting patterns which physically connect the line conductive patterns to each other, and each of the electric field appliers is defined in at least part of one of the connecting patterns.

8. The method of claim 7, wherein each of the electric field appliers is formed to a width of approximately 5 to 50 nm from an edge of the substrate.

9. The method of claim 2, further comprising performing an edge isolation process in which the electric field appliers are isolated from the first conductive pattern.

10. The method of claim 1, wherein in the crystallizing of at least part of the photoelectric conversion layer, an electric field is applied for 1/100,000 to 1 second.

11. The method of claim 3, wherein in the crystallizing of at least part of the photoelectric conversion layer, an electric field is applied for 1/100,000 to 1 second.

12. The method of claim 1, wherein the first impurities of the first amorphous semiconductor layer are Group VB impurities, and the second impurities of the third amorphous semiconductor layer are Group IIIB impurities.

13. A method of manufacturing a photovoltaic device, the method comprising:

forming a first conductive pattern, in which one or more electric field appliers are defined, on a substrate;
forming a photoelectric conversion layer on the first conductive pattern;
forming a second conductive layer on the photoelectric conversion layer; and
exposing the electric field appliers between the forming of the photoelectric conversion layer and the forming of the second conductive layer or after the forming of the second conductive layer,
wherein the photoelectric conversion layer comprises a first amorphous semiconductor layer containing first impurities, a second intrinsic, amorphous semiconductor layer, and a third amorphous semiconductor layer containing second impurities.

14. The method of claim 13, further comprising crystallizing at least part of the photoelectric conversion layer by applying an electric field to the photoelectric conversion layer using the electric field appliers after the exposing of the electric field appliers.

15. The method of claim 14, wherein a plurality of electric field appliers are defined in the first conductive pattern and separated from each other, and, in the crystallizing of at least part of the photoelectric conversion layer, an electric field is applied to the photoelectric conversion layer by applying an electric field to the electric field appliers.

16. The method of claim 14, wherein, in the crystallizing of at least part of the photoelectric conversion layer, an electric field is applied to the photoelectric conversion layer by applying an electric field to the exposed electric field appliers and the second conductive layer.

17. The method of claim 14, wherein, in the crystallizing of at least part of the photoelectric conversion layer, an electric field is applied for 1/100,000 to 1 second.

18. The method of claim 15, wherein, in the crystallizing of at least part of the photoelectric conversion layer, an electric field is applied for 1/100,000 to 1 second.

19. The method of claim 13, wherein the first conductive pattern comprises a plurality of line patterns and a plurality of connecting patterns which physically connect the line patterns to each other, and each of the electric field appliers is defined in at least part of one of the connecting patterns.

20. The method of claim 19, wherein each of the electric field appliers is formed to a width of approximately 5 to 50 nm from an edge of the substrate.

21. The method of claim 13, further comprising performing an edge isolation process in which the electric field appliers are isolated from the first conductive pattern.

22. A method of manufacturing a photovoltaic device, comprising:
forming a first conductive pattern, in which one or more electric field appliers are defined, on a substrate;
forming a first photoelectric conversion layer on the first conductive pattern;
forming an intermediate layer of material on said first photoelectric conversion layer;
forming a second photoelectric conversion layer on said intermediate layer;
forming a second conductive layer on the second photoelectric conversion layer;
exposing the electric field appliers between the forming of the second photoelectric conversion layer and the forming of the second conductive layer or after the forming of the second conductive layer.

* * * * *